(12) United States Patent
Katoh

(10) Patent No.: US 7,863,660 B2
(45) Date of Patent: Jan. 4, 2011

(54) PHOTODIODE AND DISPLAY DEVICE

(75) Inventor: Hiromi Katoh, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 202 days.

(21) Appl. No.: 11/914,592

(22) PCT Filed: Apr. 19, 2006

(86) PCT No.: PCT/JP2006/308219
§ 371 (c)(1),
(2), (4) Date: Nov. 16, 2007

(87) PCT Pub. No.: WO2006/129428
PCT Pub. Date: Dec. 7, 2006

(65) Prior Publication Data
US 2009/0050891 A1    Feb. 26, 2009

(30) Foreign Application Priority Data
May 31, 2005  (JP)  ............... 2005-160081

(51) Int. Cl.
*H01L 31/062* (2006.01)
*H01L 31/113* (2006.01)
(52) U.S. Cl. ........................ 257/292; 257/66
(58) Field of Classification Search .......... 257/66
See application file for complete search history.

(56) References Cited

U.S. PATENT DOCUMENTS

| | | | |
|---|---|---|---|
| 5,608,232 A | | 3/1997 | Yamazaki et al. |
| 5,618,741 A | * | 4/1997 | Young et al. ............... 438/151 |
| 7,217,955 B2 | * | 5/2007 | Hamaoka et al. ............... 257/80 |
| 2001/0041397 A1 | | 11/2001 | Fukushima |
| 2002/0149017 A1 | * | 10/2002 | Gotoh et al. ................. 257/65 |
| 2003/0001800 A1 | | 1/2003 | Nakajima et al. |
| 2005/0077577 A1 | * | 4/2005 | Manna et al. ............... 257/355 |

FOREIGN PATENT DOCUMENTS

| | | |
|---|---|---|
| JP | 4-174819 | 6/1992 |
| JP | 5-241512 | 9/1993 |
| JP | 2003-249447 | 9/2003 |

OTHER PUBLICATIONS

Tada et al., "A Touch Panel Function Integrated LCD Using LTPS Technology", *IDW*, '04, pp. 349-350.
Afazalian et al., Physical Modelling and Design of thin film SOI lateral PIN Photodiodes for Blue DVD-applications, *IEEE*, Oct. 2004, pp. 21-23.
Radovanovic et al., "High-speed lateral polysilicon photodiode in standard CMOS technology", *IEEE*, 2003, pp. 521-524.
Yang et al., A High-Speed, High-Sensitivity Silicon Lateral Trench Photodetector, *IEEE*, vol. 23, No. 7, 2002, pp. 395-397.

* cited by examiner

*Primary Examiner*—Phuc T Dang
(74) *Attorney, Agent, or Firm*—Nixon & Vanderhye P.C.

(57) ABSTRACT

Disclosed is a photodiode having a silicon film (5) formed of a continuous grain silicon, where the silicon film (5) has a p-type semiconductor region (2), an intrinsic semiconductor region (3) and an n-type semiconductor region (4), which are arranged in this order along the surface of the silicon film (5). The intrinsic semiconductor region (3) is formed to be in contact with the p-type semiconductor region (2) and the n-type semiconductor region (4). The distance L from the boundary between the intrinsic semiconductor region (3) and the p-type semiconductor region (2) to the boundary between the intrinsic semiconductor region (3) and the n-type semiconductor region (4) is set to not less than 2.5 μm and not more than 10 μm. The distance L is preferably set to not less than 3 μm and not more than 7 μm.

4 Claims, 6 Drawing Sheets

Change in generation current

PHOTODIODE AND DISPLAY DEVICE

This application is the U.S. national phase of International Application No. PCT/JP2006/308219 filed 19 Apr. 2006 which designated the U.S. and claims priority to Japanese Patent Application No. 2005-160081 filed 31 May 2005, the entire contents of each of which are hereby incorporated by reference.

TECHNICAL FIELD

The present invention relates to a photodiode and a display device using the same.

BACKGROUND ART

In the field of display devices represented by liquid crystal display devices, since the brightness of the display screen is adjusted in accordance with the intensity of ambient light of the display device (hereinafter, referred to 'ambient light'), it has been proposed to provide a light sensor in the display device (see patent documents 1 and 2 for example). When the light sensor is provided in a transmission liquid crystal display device, the intensity of the backlight can be enhanced in a bright environment such as exterior, and the intensity of the backlight can be decreased in a relatively dark environment such as nighttime or interior. Thereby, the visibility of the screen is improved, the power consumption is reduced and the lifetime of the liquid crystal display device is increased.

For example, the light sensor can be provided in the liquid crystal display device by mounting a light sensor as a discreet component on a liquid crystal display panel. In a recent experiment, a light sensor is formed monolithically on an active matrix substrate that composes the liquid crystal display panel (see patent document 3 for example). In the latter case, the light sensor is formed on a glass substrate to be a base of the active matrix substrate, at the same time of a process for forming an active element (TFT) or an environmental circuit, by use of the process for forming these TFT and the circuit. According to this process, it is possible to decrease the number of members so as to reduce the manufacture cost, and also provide a smaller display device in comparison with the former case.

For the light sensor of the latter case, for example, a PIN photodiode is known (see Non-patent document 1 for example). This PIN photodiode has a so-called lateral structure. Specifically, the PIN photodiode as disclosed in the above-mentioned Non-patent document 1 has a p-type semiconductor region (p-layer), an intrinsic semiconductor region (i-layer) and an n-type semiconductor region (n-layer) arranged in this order in the surface direction. The p-layer, the i-layer and the n-layer are formed on a polysilicon thin film formed on the glass substrate.

The Non-patent document 1 discloses a research result that the sensitivity of the PIN photodiode can be enhanced by increasing the length of the i-layer (that is, a distance between the p-layer and the n-layer). Therefore, conventionally, the PIN photodiode using the polysilicon thin film is designed to increase the width of the i-layer as much as possible.

Furthermore, the polysilicon thin film composing the PIN photodiode is a thin film common to the polysilicon thin film composing the active element (TFT). It is formed simultaneously in the process of forming the polysilicon thin film composing the active element. According to the recent tendency, for improving the performance of the active element, the active element is formed of a continuous grain silicon (CGS) having electron mobility higher than that of the poly- silicon thin film (see patent documents 4-6 for example). In this case, the PIN photodiode is also formed of the CGS thin film.

Patent document 1: JP H04-174819 A

Patent document 2: JP H405-241512 A

Patent document 3: JP 2002-175026 A (FIG. 12)

Patent document 4: JP H06-244103 A

Patent document 5: JP 2001-319878 A

Patent document 6: JP 2003-249447 A

Non-patent document 1: N. Tada and 6 others "A Touch Panel Function Integrated LCD Using LTPS Technology", Late-News Paper AMD 7-4L, the 11$^{th}$ International Display Workshop 2004, p. 349-350

SUMMARY

The physical properties of the PIN photodiode formed of the polysilicon thin film have been analyzed as described in the Non-patent document 1, but the physical properties of the PIN photodiode formed of the CGS thin film have not been analyzed yet. Therefore, it is extremely difficult to provide excellent performance to the PIN photodiode formed of the CGS thin film.

Moreover, since the CGS thin film has excellent properties that the electron mobility is higher than that of the polysilicon thin film, the number of liquid crystal display devices including the CGS thin films tends to increase. Therefore, it is the urgent necessity to provide excellent performance to the photodiode formed of the CGS thin film.

An embodiment of the present invention provides a photodiode of a lateral structure formed of a continuous grain silicon (CGS) film and having excellent performance, and also a display device using the photodiode.

The photodiode includes a silicon film formed of a continuous grain silicon, wherein the silicon film includes a first conductivity-type semiconductor region, an intrinsic semiconductor region, and a second conductivity-type semiconductor region opposite to the first conductivity-type, which are arranged in this order along the surface of the silicon film; the intrinsic semiconductor region is formed to be in contact with the first conductivity-type semiconductor region and the second conductivity-type semiconductor region, and a distance from the boundary between the intrinsic semiconductor region and the first conductivity-type semiconductor region to the boundary between the intrinsic semiconductor region and the second conductivity-type semiconductor region is set to not less than 2.5 μm and not more than 10 μm.

In another embodiment, a display device includes an active matrix substrate on which a plurality of active elements are formed, and a photodiode for outputting signals by reaction with ambient light, wherein the photodiode includes a silicon film formed of the continuous grain silicon on a base of the active matrix substrate; the silicon film includes a first conductivity-type semiconductor region, an intrinsic semiconductor region, and a second conductivity-type semiconductor region opposite to the first conductivity-type, which are arranged in this order along the surface of the silicon film; the intrinsic semiconductor region is formed to be in contact with the first conductivity-type semiconductor region and the second conductivity-type semiconductor region; and a distance from the boundary between the intrinsic semiconductor region and the first conductivity-type semiconductor region to the boundary between the intrinsic semiconductor region and the second conductivity-type semiconductor region is set to not less than 2.5 μm and not more than 10 μm.

The "intrinsic semiconductor region" is not limited particularly as long as it is electrically neutral in comparison with the adjacent first conductivity-type semiconductor region and the second conductivity-type semiconductor region. It should be noted that preferably the "intrinsic semiconductor region" is completely free of impurities and/or it is a region where the conduction electron density and the hole density are equal to each other. The display device is not limited particularly as long as it includes an active matrix substrate. It is not limited to a liquid crystal display device but it can be an EL display device.

As mentioned above, in the PIN photodiode formed of the continuous grain silicon film, the length of the i-layer can be adjusted suitably. Therefore, even in a case of forming the photodiode monolithically on the active matrix substrate on which active elements are formed as the continuous grain silicon film, the photodiode can be provided with excellent performance.

BRIEF DESCRIPTION OF DRAWINGS

FIG. 3 includes diagrams showing the configuration of a photodiode according to the embodiment of the present invention.

DESCRIPTION

A photodiode according to an embodiment of the present invention includes a silicon film formed of a continuous grain silicon; wherein the silicon film includes a first conductivity-type semiconductor region, an intrinsic semiconductor region, and a second conductivity-type semiconductor region opposite to the first conductivity-type, which are arranged in this order along the surface of the silicon film; the intrinsic semiconductor region is formed to be in contact with the first conductivity-type semiconductor region and the second conductivity-type semiconductor region; and a distance from the boundary between the intrinsic semiconductor region and the first conductivity-type semiconductor region to the boundary between the intrinsic semiconductor region and the second conductivity-type semiconductor region is set to not less than 2.5 μm and not more than 10 μm.

The silicon film can be formed on a base of an active matrix substrate including a plurality of active elements. Namely, the photodiode can be formed monolithically on an active matrix substrate for composing a display device.

Furthermore, a display device embodiment has an active matrix substrate on which a plurality of active elements are formed, and a photodiode for outputting a signal by reaction with ambient light, wherein the photodiode includes a silicon film formed of the continuous grain silicon on a base of the active matrix substrate; the silicon film includes a first conductivity-type semiconductor region, an intrinsic semiconductor region, and a second conductivity-type semiconductor region opposite to the first conductivity-type, which are arranged in this order along the surface of the silicon film; the intrinsic semiconductor region is formed to be in contact with the first conductivity-type semiconductor region and the second conductivity-type semiconductor region; and a distance from the boundary between the intrinsic semiconductor region and the first conductivity-type semiconductor region to the boundary between the intrinsic semiconductor region and the second conductivity-type semiconductor region is set to not less than 2.5 μm and not more than 10 μm.

In the photodiode and the display device, it is preferable that the distance from the boundary between the intrinsic semiconductor region and the first conductivity-type semiconductor region to the boundary between the intrinsic semiconductor region and the second conductivity-type semiconductor region is set to not less than 3 μm and not more than 7 μm. In this case, it is possible to suppress variation of the output value of the photodiode, which is caused by the change in the reverse bias voltage, thereby improving the detection accuracy.

EMBODIMENT

Figure 1:
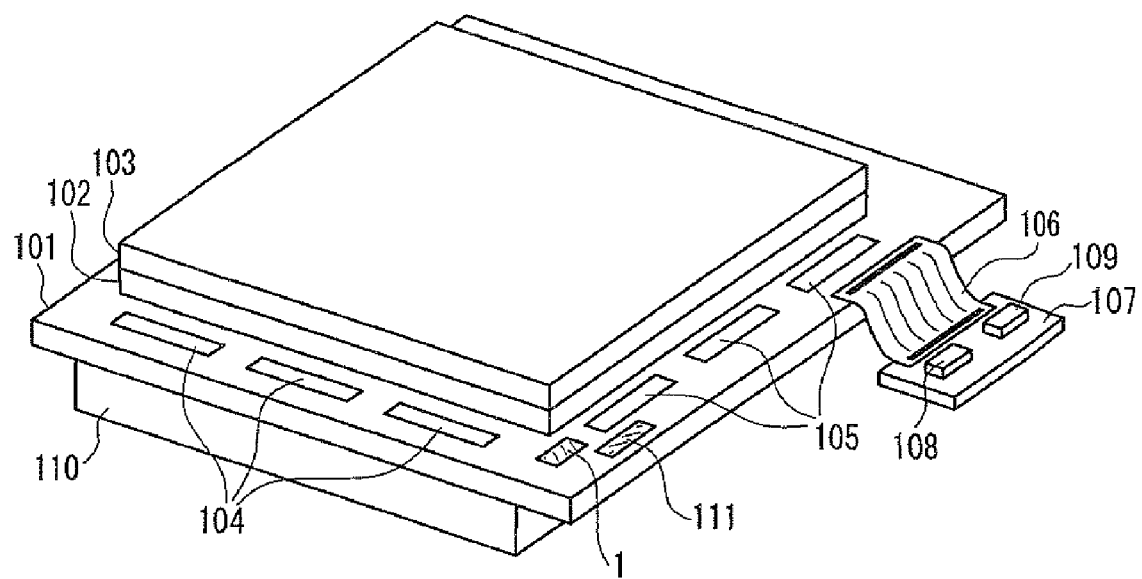
FIG. 1 is a perspective view showing a schematic configuration of a display device according to an embodiment of the present invention.

Hereinafter, the photodiode and the display device according to an embodiment of the present invention will be described below with reference to FIGS. 1-6. First, the entire configuration of the display device according to this embodiment will be described with reference to FIG. 1. FIG. 1 is a perspective view showing a schematic configuration of the display device according to this embodiment.

As shown in FIG. 1, in this embodiment, the display device is a liquid crystal display device. The display device includes a liquid crystal display panel formed by sandwiching a liquid crystal layer 102 between an active matrix substrate 101 and an opposing substrate 103, and a backlight 110. The backlight 110 illuminates the liquid crystal display panel from the active matrix substrate 101 side.

In the active matrix substrate 101, the region to be in contact with the liquid crystal layer 102 is a display region. In the display region, though not shown in FIG. 1, a plurality of pixels including active elements and pixel electrodes are formed in matrix. The configuration of the active elements will be described below with reference to FIG. 2.

For detecting the intensity of the ambient light, in the region around the display region of the active matrix substrate 101 (hereinafter referred to as 'peripheral region'), a photodiode 1 according to this embodiment is provided. The photodiode 1 outputs a current (generation current) of an intensity corresponding to the intensity of the ambient light to a detector 111 provided also in the peripheral region.

The detector 111 has a capacitance, and stores the generation current outputted by the light sensor in the capacitance so as to generate a voltage signal. In this embodiment, the detector 111 compares the potential of this voltage signal with a reference potential so as to generate a digital signal for specifying the level of the potential of the voltage signal. This digital signal is inputted into a controller (not shown) of the backlight 110, so that the brightness of the backlight 110 is adjusted in accordance with the intensity of the ambient light.

When the liquid crystal display device as shown in FIG. 1 is packaged in mobile equipment such as a mobile phone for example, a reference potential of about 4 to 5 levels is set. In this case, the digital signal outputted by the detector 111 is 2 bits or more.

As shown in FIG. 3 mentioned below, the photodiode 1 is formed monolithically on a base (glass substrate) of the active matrix substrate 101. In this embodiment, the detector 111 also is formed monolithically on the base. In this disclosure, "being formed monolithically on a glass substrate" indicates that an element is formed directly on the glass substrate through a physical process and/or a chemical process, which does not include mounting a semiconductor circuit on a glass substrate.

Moreover, on the peripheral region of the active matrix substrate 101, a horizontal driving circuit (source driver) 104 and a vertical driving circuit (gate driver) 105 are provided as well. Semiconductor elements composing either the horizontal driving circuit 104 or the vertical driving circuit 105 are formed monolithically on the base (glass substrate) of the active matrix substrate 101.

To the active matrix substrate 101, an external substrate 107 is connected via an FPC 106. On the external substrate 107, an IC chip 108 and an IC chip 109 are mounted. The IC chip 109 includes a reference power supply circuit for generating a power supply voltage used in the display device. The IC chip 108 includes a control circuit for controlling the horizontal driving circuit 104 and the vertical driving circuit 105. In this embodiment, it is also possible to mount an IC chip other than the IC chips 108 and 109 on the external substrate 107.

Figure 2:
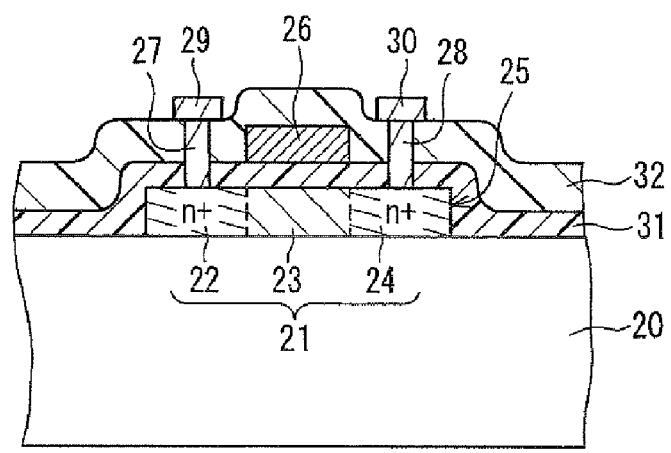
FIG. 2 is a cross-sectional view showing the configuration of an active element formed on the active matrix substrate shown in FIG. 1.

The configuration of the active elements will be described below with reference to FIG. 2. FIG. 2 is a cross-sectional view showing the configuration of an active element formed on the active matrix substrate as shown in FIG. 1. As shown in FIG. 2, the active element 21 includes a silicon film 25 formed on a glass substrate 20 and a gate electrode 26 arranged on the upper layer of the silicon film. The glass substrate 20 is the base for the active matrix substrate 101 (see FIG. 1). In FIG. 2, hatching for indicating the glass substrate 20 is omitted.

The active element 21 as shown in FIG. 2 is an n-type TFT. On the silicon film 25, n-type semiconductor regions 22 and 24 to be a source or drain of the TFT are formed. Formation of the n-type semiconductor regions 22 and 24 is carried out by ion implantation of n-type impurities such as phosphorus (P) and arsenic (As). Numeral 23 denotes a channel region to be the channel of the TFT.

In this embodiment, the silicon film 25 is formed of a continuous grain silicon (CGS). The continuous grain silicon (CGS) has continuity in the arrangement of atoms between particles of the silicon crystal (crystal grain), and thus the electron mobility is higher than that of an amorphous silicon or a polysilicon.

In the continuous grain silicon (CGS), the average of the crystal particle diameter of the silicon crystal is 0.1 μm (100 nm) to 20 μm, preferably, 0.5 μm (500 nm) to 20 μm. The crystal grain diameter can be measured in the following manner, for example. First, an analysis of crystal orientation is performed by using an electron backscatter diffraction pattern (EBSP). Regions having the identical crystal orientation are determined one silicon crystal grain, and the diameter is measured.

Formation of the silicon film 25 using the CGS film can be carried out in the following manner for example. First, a silicon oxide film and an amorphous silicon film are formed on the glass substrate 20 in this order. Next, on the surface layer of the amorphous silicon film, a nickel thin film to serve as a catalyst for accelerating crystallization is formed. Next, the nickel thin film and the amorphous silicon film are reacted to each other by applying heat so as to form a crystal silicon layer on the interface. Subsequently, unreacted nickel film and a nickel silicide layer are removed by etching or the like. Next, the remaining silicon film is annealed to advance the crystallization, thereby the CGS film is obtained. Later, the CGS film subjected to patterning by formation of a resist pattern by photolithography and etching with use of the resist pattern as a mask, thereby the silicon film 25 as shown in FIG. 2 is obtained.

As shown in FIG. 2, a first interlayer insulating film 31 is formed between the gate electrode 26 and the silicon film 25. A part of the first interlayer insulating film 31 right under the gate electrode 26 functions as a gate insulating film. In the example of FIG. 2, formation of the first interlayer insulating film 31 is carried out by forming a silicon nitride film or a silicon oxide film by a CVD method after formation of the silicon film 25. Formation of the gate electrode 26 is carried out by forming a conductive film such as a silicon film on the first interlayer insulating film 31 by the CAD method or the like, and subsequently forming a resist pattern by photolithography and performing an etching with use of the resist pattern as a mask.

On the first interlayer insulating film 31, a second interlayer insulating film 32 is formed so as to cover the gate electrode 26. Formation of the second interlayer insulating film 32 is carried out by forming a silicon nitride film or a silicon oxide film by a CVD method after formation of the gate electrode 26 similarly to the case of the first interlayer insulating film 31. Furthermore, contact plugs 27 and 28 are formed. The contact plugs 27 and 28 penetrate the first interlayer insulating film 31 and the second interlayer insulating film 32 so as to be connected to the semiconductor region 22 or 24. On the second interlayer insulating film 32, electrode patterns 29 and 30 to be connected to the contact plug 27 or 28 are formed as well.

Figure 3A:
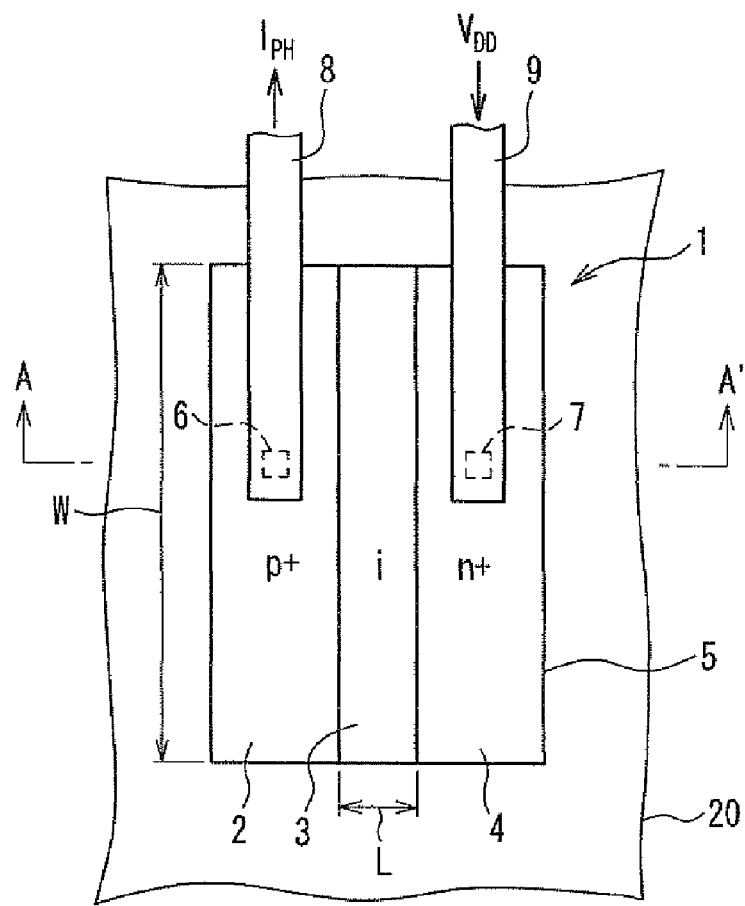
FIG. 3A is a plan view.
Figure 3B:
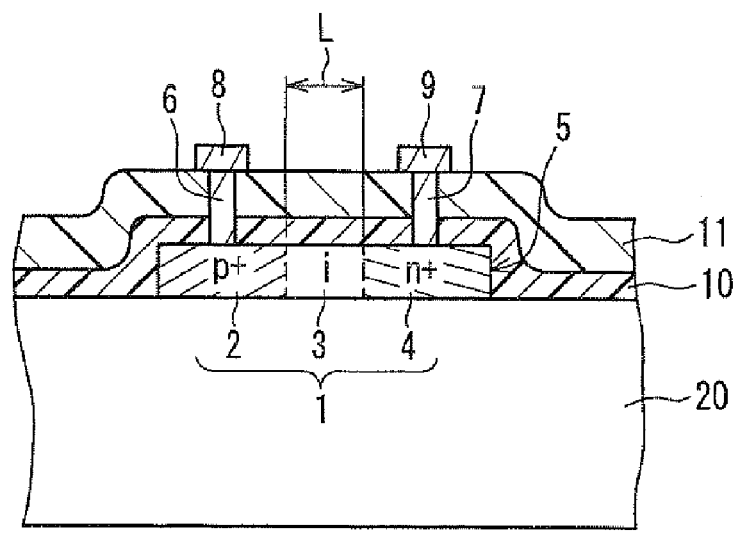
FIG. 3B is a cross-sectional view taken along the line A-A' in FIG. 3A.

The configuration of the photodiode 1 as shown in FIG. 1 will be described specifically with reference to FIG. 3. FIG. 3 includes diagrams showing the configuration of the photodiode according to this embodiment of the present invention. FIG. 3A is a plan view, and FIG. 3B is a cross-sectional view taken along the line A-A' in FIG. 3A. In FIG. 3, hatching for indicating the glass substrate 20 is omitted.

As shown in FIGS. 3A and 3B, in this embodiment, the photodiode 1 is a PIN photodiode. The photodiode 1 includes a silicon film 5 formed on the glass substrate 20 as a base of the active matrix substrate 101 (see FIG. 1). The silicon film 5 includes a p-type semiconductor region (p-layer) 2, an intrinsic semiconductor region (i-layer) 3 and an n-type semiconductor region (n-layer) 4. The p-layer 2, the i-layer 3 and the n-layer 4 are arranged in this order along the surface of the silicon film 5 and compose a lateral structure.

The i-layer 3 is formed to be in contact with the p-layer 2 and the n-layer 4, and interfaces are formed between the i-layer 3 and the p-layer 2, and also between the i-layer 3 and the n-layer 4. Furthermore, in this embodiment, as shown in FIG. 3A, the p-layer 4, the i-layer 3 and the n-layer 4 are shaped like strips.

Like the silicon film 25 composing the active element 21 (see FIG. 2), the silicon film 5 is formed of the CGS film. The silicon film 5 is formed at the same time of formation of the silicon film 25, by the step of forming the silicon film 25 of the active element 21. The n-layer 4 and the p-layer 2 of the silicon film 5 are formed by using the step (on implantation step) of forming the active element 21 (see FIG. 2) or the p-type or n-type semiconductor region of the horizontal driving circuit 104 and the vertical driving circuit 105 (see FIG. 1).

For example, the n-layer 4 of the silicon film 5 can be formed by the step (ion implantation step) for forming the semiconductor regions 22 and 24 of the active element 21 as shown in FIG. 2. When formation of the semiconductor regions 22 and 24 of the active element 21 is carried out by plural cycles of ion implantation in different implantation conditions, an ion implantation optimal to the formation of the n-layer 4 is selected from the ion implantations.

The i-layer 3 of the silicon film 5 is not limited particularly as long as it is formed to be more neutral electrically in comparison with the n-layer 4 and the p-layer 2. In this embodiment, the i-layer 3 is formed so that the impurity concentration is lower than the impurity concentration of the n-layer 4 and the impurity concentration of the p-layer 2. For example, the i-layer 3 can be formed by providing a mask on the region for forming the i-layer 3 at the time of the ion implantation. When the formed silicon film is not neutral electrically the i-layer 3 can be formed by performing an ion implantation on the region for forming the i-layer 3. In a case of performing an ion implantation, an ion implantation step in an optimal condition can be selected and applied among the ion implantation steps to be carried out at the time of forming the active element 21, the horizontal driving circuit 104 and the vertical driving circuit 105. It should be noted that the i-layer 3 can be formed by any methods for electrically neutralizing the region to be the i-layer 3, and the method for forming the i-layer 3 is not limited to the above-mentioned methods.

Furthermore, in this embodiment, for providing a proper sensitivity to the photodiode 1, the length L of the i-layer 3 is set to not less than 2.5 μm and not more than 10 μm, preferably not less than 3 μm and not more than 7 μm. This will be described in detail with reference to FIGS. 4-6. The length L of the i-layer 3 corresponds to the distance from the boundary (interface) between the i-layer 3 and the p-layer 2 to the boundary (interface) between the i-layer 3 and the n-layer 4.

As shown in FIG. 3B, on the upper surface of the photodiode 1, a first interlayer insulating film 10 and a second interlayer insulating film 11 are laminated in this order. Formation of the first interlayer insulating film 10 and the second interlayer insulating film 11 is carried out by using the step of forming the first interlayer insulating film 31 or the second interlayer insulating film 32 of the active element 21 as shown in FIG. 2. IP FIG. 3A, the first interlayer insulating film 10 and the second interlayer insulating film 11 are not shown.

On the second interlayer insulating film 11, electrode patterns 8 and 9 are formed. Further, in the first interlayer insulating film 10 and the second interlayer insulating film 11, contact plugs 6 and 7 are formed to penetrate these films. The contact plug 6 connects the p-layer 2 and the electrode pattern 8. The contact plug 7 connects the n-layer 4 and the electrode pattern 9. The contact plugs 6 and 7 are formed by using the process of forming the contact plugs 27 and 28 of the active element 21 as shown in FIG. 2. The electrode patterns 8 and 9 are formed by using the process of forming the electrode patterns 29 and 30.

The electrode pattern 9 connected to the n-layer 4 is connected to the power supply potential $V_{DD}$, and thus a reverse bias voltage is applied to the n-layer 4. As a result, when a light beam enters the i-layer 3, a current $I_{PH}$ (generation current) flows from the n-layer 4 as an anode to the p-layer 2 as a cathode. Moreover, the current $I_{PH}$ is outputted to the detector 111 (see FIG. 1) through the electrode pattern 8. Here, the generation current outputted from the electrode pattern 8 includes not only the photoelectric current caused by only the light incidence but also the dark current. Therefore, actually, the current value of the generation current is the sum of the current value of the photoelectric current and the current value of the dark current.

Figure 4A:
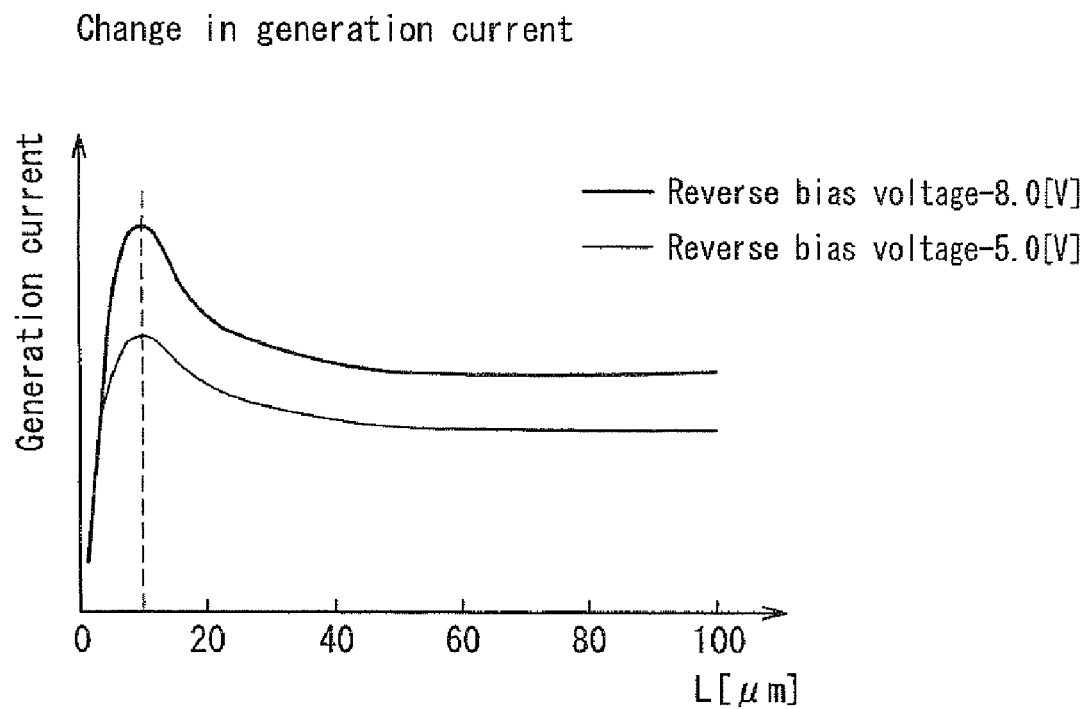
FIG. 4 includes graphs showing changes of generation currents in a photodiode formed of a CGS film.
FIG. 4B is a graph showing an enlarged part of FIG. 4A.
Figure 4B:
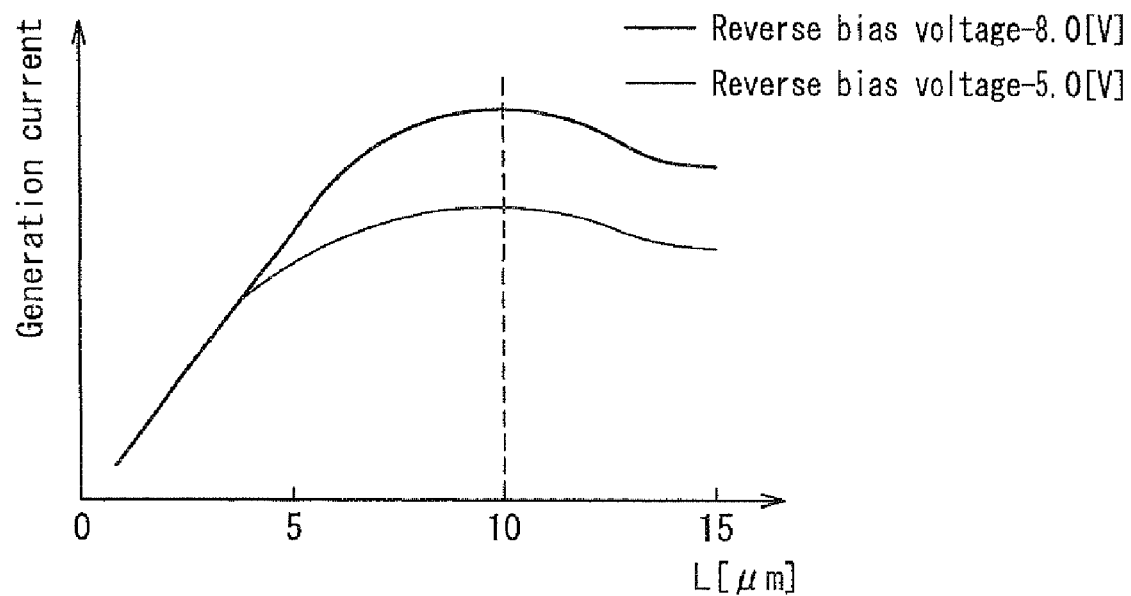
Figure 5A:
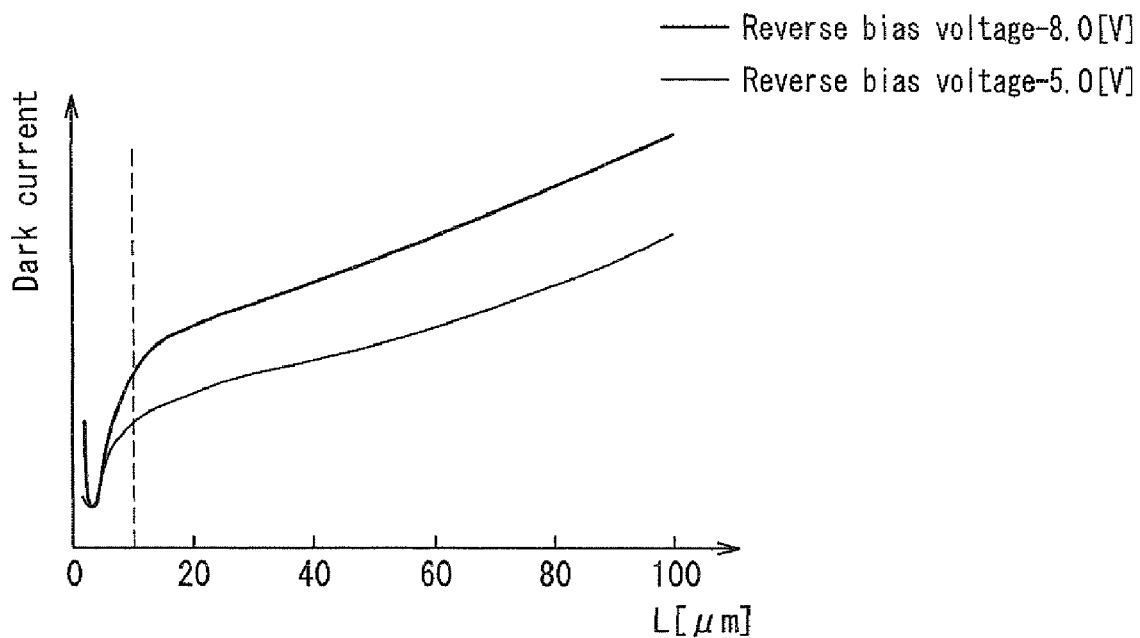
FIG. 5 includes graphs showing changes in dark currents in the photodiode formed of the CGS film.
FIG. 5B is a graph showing an enlarged part of FIG. 5A.
Figure 5B:
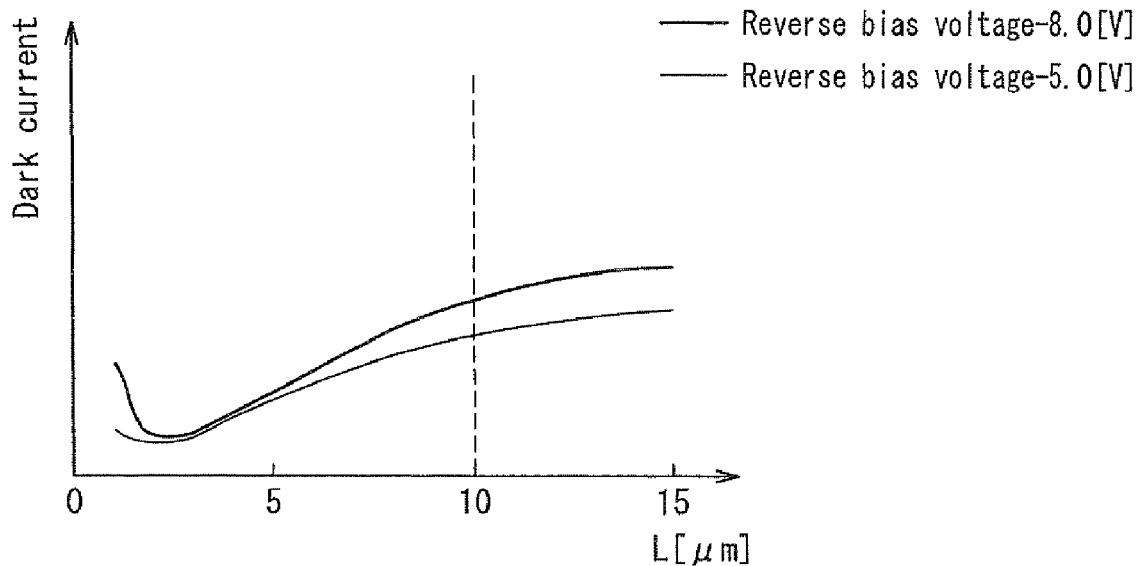
Figure 6A:
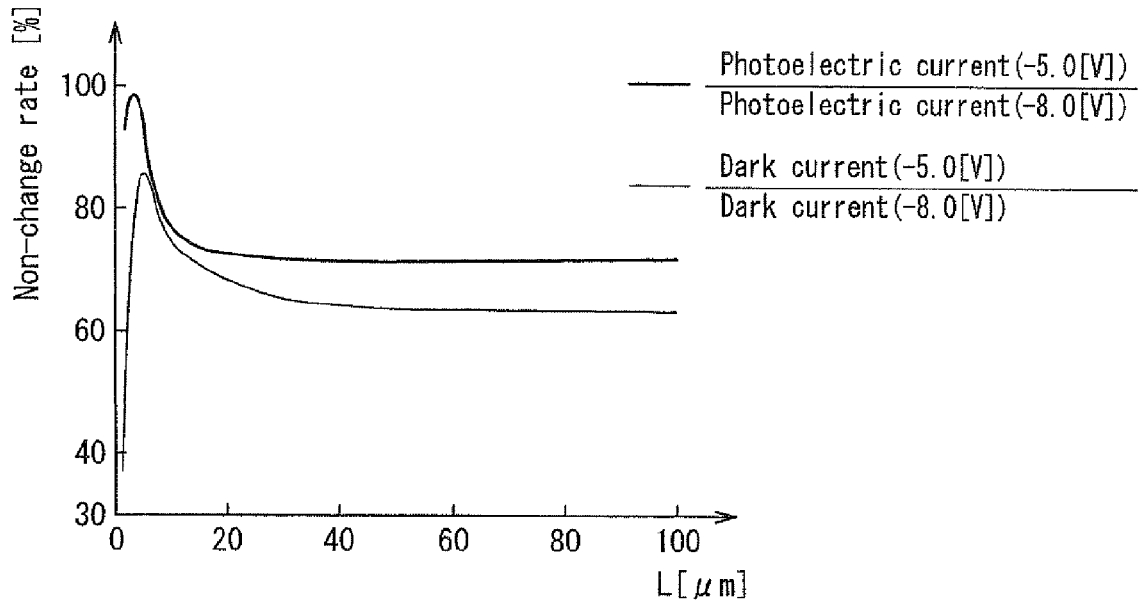
FIG. 6 includes graphs showing changes of currents, which are caused by the changes in the reverse bias voltage in the photodiode formed of the CGS film.
FIG. 6B is a graph showing an enlarged part of FIG. 6A.
Figure 6B:
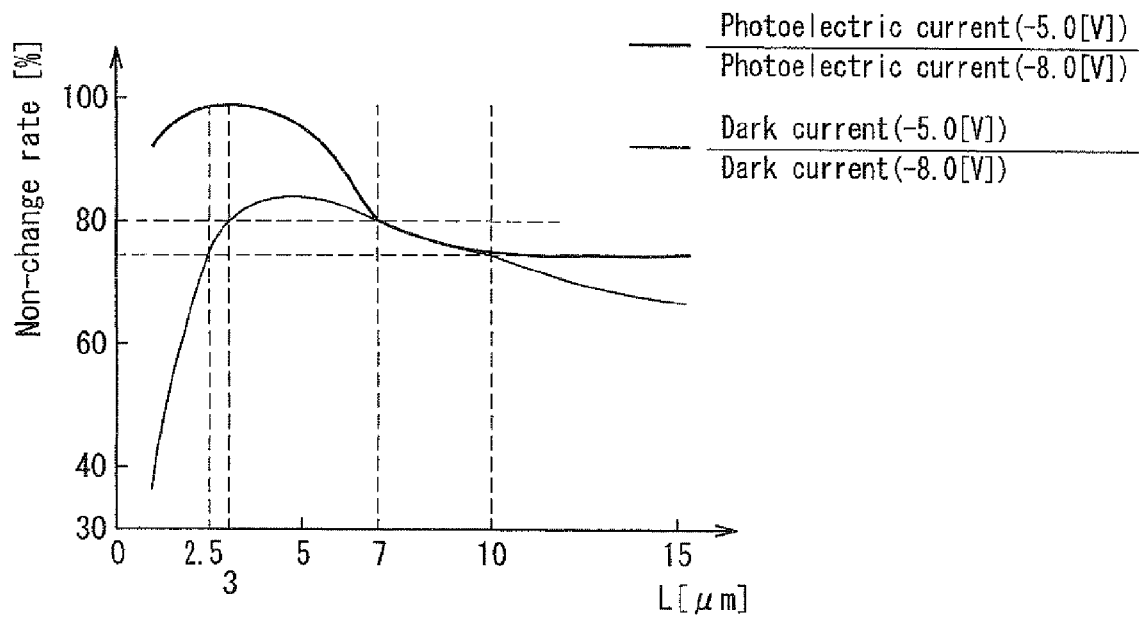

Next, the length L of the i-layer 3 of the photodiode (PIN photodiode) 1 formed of the CGS film will be described, together with the physical properties of the photodiode 1, with reference to FIGS. 4-6. FIGS. 4A and 4B show changes of the generation currents in a photodiode formed of a CGS film. FIG. 4B is a partial enlarged view of FIG. 4A. FIGS. 5A and 5B show changes of the dark currents in the photodiode formed of the CGS film. FIG. 5B is a partial enlarged view of FIG. 5A. FIGS. 6A and 6B shows changes of the currents, which are caused by the variation in the reverse bias voltage in the photodiode formed of the CGS film. FIG. 6B is a partial enlarged view of FIG. 6A.

The graphs as shown in FIGS. 4-6 are obtained by using the PIN photodiode formed of a CGS film having an electron mobility of about 200 [cm$^2$/vs] to about 400 [cm$^2$/vs]. In this PIN photodiode, the p-layer is formed by ion implantation of p-type impurities such as boron (B) and indium (In). The n-type layer is formed by ion implantation of n-type impurities such as phosphorus (P) and arsenic (As).

In FIGS. 4-6, the x-axis indicates the length L of the i-layer. In FIGS. 4-6, the width W of the i-layer is kept constant, and only the length L of the i-layer is varied. The y-axis in FIG. 4 indicates the generation current, and the y-axis in FIG. 5 indicates a dark current. Further, each of FIGS. 4 and 5 shows the result for a case where the reverse bias voltage to be applied to the n-layer 4 of the photodiode 1 is set to −8 [V] and a case where the reverse bias voltage is set to −5 [V].

The y-axis in FIG. 6 indicates the non-change rates of the photoelectric current and the dark current, with respect to the variation in the reverse bias voltage. The non-change rate of the photoelectric current is calculated by dividing the current value of the photoelectric current in a case where the reverse bias voltage to be applied to the n-layer 4 of the photodiode 1 is set to −5 [V] by the current value of the photoelectric current in a case where the reverse bias voltage is set to −8 [V]. The non-change rate of the dark current is calculated by dividing the current value of the dark current in a case where the reverse bias voltage is set to −5 [V] by the current value of the dark current in a case where the reverse bias voltage is set to −8 [V].

As shown in FIGS. 4A and 4B, the generation current of the photodiode 1 increases monotonously until the length L of the i-layer 3 becomes 10 μm, and later it declines slowly. Therefore, in both the region where L is not less than 10 μm and the region where L is not more than 10 μm, L values for obtaining generation currents of the same level exist. From the viewpoint of the sensitivity of the photo diode 1, a larger generation current is preferred.

In contrast, as shown in FIGS. 5A and 5B, the dark current of the photodiode tends to increase further even after L exceeds 10 μm. When the dark current is larger, the sensitivity of the light sensor system including the photodiode 1 and the detector 111 deteriorates, and/or the dynamic range becomes narrow. Furthermore, when L is larger, the photodiode 1 becomes larger. Therefore, when the obtained generation current is in the substantially same level, a smaller L is preferred. As the generation current is maximized when L is 10 μm, L is set not to be larger than 10 μm as mentioned above.

The non-change rate as shown in FIG. 6 indicates the level of the change in either the photoelectric current or the dark current when the reverse bias voltage applied to the anode (n-layer 4) of the photodiode 1 varies from −8 [V] to −5 [V].

As the non-change rate (NCR) is closer to 100% (higher), the dependency due to the reverse bias voltage is decreased. At the photodiode 1, it is preferable that the dependency due to the reverse bias voltage is smaller. The reason is as follows.

For example, like the case of the above-mentioned detector 111 (see FIG. 1), when an apparatus that stores the generation current in a capacitance and sets a voltage generated in the capacitance as the output value is used, the reverse bias voltage applied to the PIN photodiode is increased/decreased in accordance with the voltage generated at the capacitance. At this time, when the generation current to the same illumination changes drastically corresponding to the change in the reverse bias voltage, the precision of the light sensor system including the detector 111 will deteriorate considerably. For this reason, it is preferable that the value of the generation current (photoelectric current) to an illumination is constant even when the reverse bias voltage changes. In the photodiode 1, it is preferable that the dependency due to the reverse bias voltage is smaller.

Therefore, L must be set by taking the non-change rate into consideration as well. First, the above-mentioned upper limit of L will be verified on the basis of the non-change rate of the photoelectric current. As shown in FIG. 6B, the non-change rate of the photoelectric current (photoelectric NCR) becomes approximately 100% when L is about 2.5 µm to about 3.5 µm. In a region where L is less than 2.5 µm and a region where L exceeds 3.5 µm, the non-change rate of the photoelectric current declines. The decline range in the region where L is less than 2.5 µm is small, and the minimum value of the non-change rate of the photoelectric current at that time will be larger than that when L is 10 µm. Therefore, when considering the non-change rate of the photoelectric current, there is no particular limitation as long as L is set to not more than 10 µm. In this case, the non-change rate of the photoelectric current can be kept not higher than a certain level.

Next, the above-mentioned upper limit of L will be verified on the basis of the non-change rate of the dark current (dark NCR). As shown in FIG. 6B, the non-change rate of the dark current has its peak when L is about 5 µm. In the region where L is less than 5 µm and the region where L exceeds 5 µm, the non-change rate of the dark current declines. It must be noted that the decline range in the region where L is less than 5 µm is larger than the decline range in the region where L exceeds 5 µm. Particularly, the non-change rate of the dark current where L is 2.5 µm is substantially equivalent to the non-change rate of the dark current where L is 10 µm. However, in the region where L is less than 2.5 µm, the non-change rate of the dark current deteriorates considerably in comparison with the case where L is 10 µm. Therefore, when considering the non-change rate of the dark current, it is impossible to maintain the non-change rate of the dark current by only setting L not to be more than 10 µm. Therefore, L is set to not less than 2.5 µm.

In the above-mentioned detector 111 (see FIG. 1), the reference potential of n-grades is set. In this case, for preventing degradation of the precision of the light sensor system including the detector 111, the variation ratio of the output value of the voltage signal of the detector 111 must be suppressed not to exceed 1/n. Therefore, for example, when a liquid crystal display device is packaged in mobile equipment, the reference potential is set in about 4 to 5 grades, and thus, it is requested to suppress the variation ratio of the output value of the voltage signal of the detector 111 to a range of 1/5 to 1/4 (20% to 25%). The variation ratios of the output values of the photoelectric current and the dark current correspond to the variation ratio of the output value of the photodiode 1, and it has a direct connection to the variation ratio of the output value of the voltage signal outputted by the detector 111 (see FIG. 1). In the above-mentioned case, therefore, it is required that the variation ratios of the output values of the photoelectric current and the dark current be kept constantly not to be higher than 20%. Furthermore, this requirement can be met by keeping both the non-change rate of the photoelectric current and the non-change rate of the dark current not to be lower than 80%.

Therefore, as shown in FIG. 6B, L is set to not less than 3 µm and not more than 7 µm, so that the non-change rate of the photoelectric current and the non-change rate of the dark current will be 80% or higher constantly. Namely in this case, the variation ratios of the output values of the photoelectric current and the dark current with respect to the variation of the reverse bias voltage will be 20% or less constantly. Particularly therefore, when a liquid crystal display device is packaged in mobile equipment, it is preferable that L is set to not less than 3 µm and not more than 7 µm.

As mentioned above, from the viewpoint of the non-change rates relating to the variation in the generation current, the dark current and the reverse bias voltage, the length L of the i-layer 3 is set to not less than 2.5 µm and not more than 10 µm. Therefore, according to this embodiment, the PIN photodiode formed of a continuous grain silicon film can have an i-layer where the length L is set to a proper value, and thus it can exhibit excellent performance. Preferably, the length L of the i-layer 3 is set to not less than 3 µm and not more than 7 µm.

In the photodiode 1 according to this embodiment, the width W of the i-layer 3 is not limited particularly, but it can be set to output a proper generation current in accordance with the length L of the i-layer 3 and/or the usage environment of the display device. Similarly, the respective lengths (length perpendicular to the width direction) of the p-layer 2 and the n-layer 4 are not limited particularly, but they can be set by considering the dimension of the contact plug 6 or 7 and the rule for designing the active matrix substrate. Further, the CGS film 5 used in this embodiment is not limited particularly as long as it has an electron mobility of not less than 200 [$cm^2/vs$], particularly in a range of about 200 [$cm^2/vs$] to about 400 [$cm^2/vs$].

Figure 7:
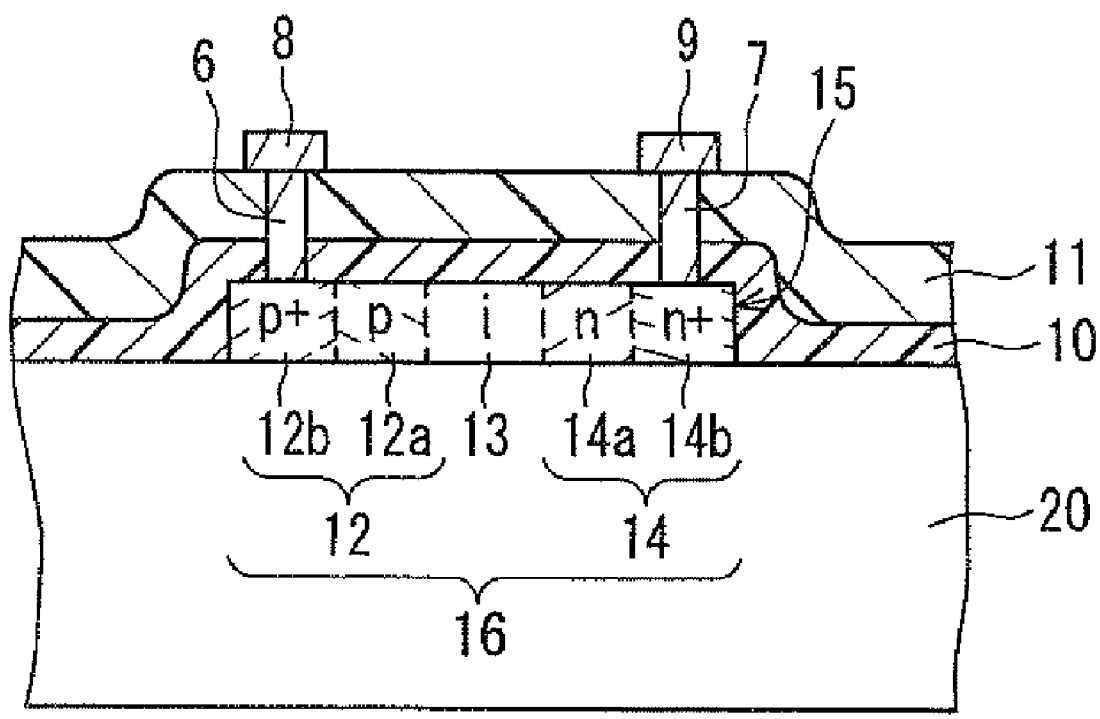
FIG. 7 is a cross-sectional view showing another example of the photodiode of the present invention.

The photodiode is not limited to the example as shown in FIG. 3. FIG. 7 is a cross-sectional view showing another example of the photodiode of the present invention. Unlike the photodiode 1 as shown in FIG. 1, the photodiode 16 as shown in FIG. 7 has an LDD structure. Specifically, a p-layer 12 includes a low-concentration p-layer 12a and a high-concentration p-layer 12b. Similarly, an n-layer 14 includes a low-concentration n-layer 14a and a high-concentration n-layer 14b.

In the example of FIG. 7, the p-layer 12 is formed by ion-implanting p-type impurities at a low concentration in the region for the low-concentration p-layer 12a, and subsequently ion-implanting p-type impurities at a high concentration in the high-concentration p-layer 12b. The n-layer 14 is formed in the same manner.

As mentioned above, in the example as shown in FIG. 7, the photodiode 16 has the LDD structure. Thereby, the energy levels on the interface between the i-layer 13 and the p-layer 12 and also on the interface between the i-layer 13 and the n-layer 14 can be changed smoothly, and thus it is possible to generate a greater photoelectric current in comparison with the example as shown in FIG. 3.

In the example as shown in FIG. 7, the silicon film 15 is formed of a CGS film, like the silicon film 5 of the photodiode 1 as shown in FIG. 3. The i-layer 13 is formed similarly to the i-layer 3 of the photodiode 1 as shown in FIG. 3. In FIG. 7, reference signs common to those in FIG. 3 indicate components equivalent to those in FIG. 3.

INDUSTRIAL APPLICABILITY

The photodiode embodiment can be packaged in a display device such as a liquid crystal display device and an EL display device. Therefore, not only the photodiode but the display device including the photodiode have industrial applicability.

The invention claimed is:

1. A photodiode, comprising:
a silicon film formed of a continuous grain silicon, wherein
the silicon film comprises a first conductivity-type semiconductor region, an intrinsic semiconductor region, and a second conductivity-type semiconductor region opposite to the first conductivity-type, which are arranged in this order along a surface of the silicon film,
the intrinsic semiconductor region is formed to be in contact with the first conductivity-type semiconductor region and the second conductivity-type semiconductor region,
a distance from a boundary between the intrinsic semiconductor region and the first conductivity-type semiconductor region to a boundary between the intrinsic semiconductor region and the second conductivity-type semiconductor region is set to not less than 2.5 μm and not more than 10 μm,
the silicon film is formed on a base of an active matrix substrate comprising a plurality of active elements, and
the base is a glass substrate and the silicon film is formed directly on the base.

2. The photodiode according to claim 1, wherein the distance from the boundary between the intrinsic semiconductor region and the first conductivity-type semiconductor region to the boundary between the intrinsic semiconductor region and the second conductivity-type semiconductor region is set to not less than 3 μm and not more than 7 μm.

3. A display device, comprising:
an active matrix substrate on which a plurality of active elements are formed; and
a photodiode for outputting a signal by reaction with ambient light, wherein
the photodiode comprises a silicon film formed of a continuous grain silicon on a base of the active matrix substrate,
the silicon film comprises a first conductivity-type semiconductor region, an intrinsic semiconductor region, and a second conductivity-type semiconductor region opposite to the first conductivity-type, which are arranged in this order along a surface of the silicon film,
the intrinsic semiconductor region is formed to be in contact with the first conductivity-type semiconductor region and the second conductivity-type semiconductor region,
a distance from a boundary between the intrinsic semiconductor region and the first conductivity-type semiconductor region to a boundary between the intrinsic semiconductor region and the second conductivity-type semiconductor region is set to not less than 2.5 μm and not more than 10 μm, and
the base of the active matrix substrate is a glass substrate and the silicon film is formed directly on the base.

4. The display device according to claim 3, wherein the distance from the boundary between the intrinsic semiconductor region and the first conductivity-type semiconductor region to the boundary between the intrinsic semiconductor region and the second conductivity-type semiconductor region is set to not less than 3 μm and not more than 7 μm.

* * * * *